United States Patent
Callegari et al.

(10) Patent No.: US 7,436,034 B2
(45) Date of Patent: Oct. 14, 2008

(54) METAL OXYNITRIDE AS A PFET MATERIAL

(75) Inventors: Alessandro C. Callegari, Yorktown Heights, NY (US); Michael A. Gribelyuk, Stamford, CT (US); Vijay Narayanan, New York, NY (US); Vamsi K. Paruchuri, New York, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 11/311,455

(22) Filed: Dec. 19, 2005

(65) Prior Publication Data

US 2007/0138578 A1 Jun. 21, 2007

(51) Int. Cl.
*H01L 21/00* (2006.01)
(52) U.S. Cl. .................. 257/407; 257/410; 257/412
(58) Field of Classification Search ............ 257/407, 257/410, 412
See application file for complete search history.

(56) References Cited

U.S. PATENT DOCUMENTS

| | | | |
|---|---|---|---|
| 6,858,906 B2* | 2/2005 | Lee et al. | 257/406 |
| 7,297,586 B2* | 11/2007 | Triyoso et al. | 438/216 |
| 2004/0256700 A1 | 12/2004 | Doris et al. | |
| 2005/0093104 A1* | 5/2005 | Ieong et al. | 257/627 |
| 2005/0116290 A1 | 6/2005 | de Souza et al. | |
| 2005/0224897 A1* | 10/2005 | Chen et al. | 257/410 |
| 2006/0166425 A1* | 7/2006 | Triyoso et al. | 438/199 |
| 2006/0172516 A1* | 8/2006 | Adetutu et al. | 438/517 |
| 2007/0138578 A1* | 6/2007 | Callegari et al. | 257/407 |
| 2007/0284677 A1* | 12/2007 | Chang et al. | 257/412 |

FOREIGN PATENT DOCUMENTS

CN 1594644 A 3/2005
JP 2007173796 A * 7/2007

OTHER PUBLICATIONS

Cartier, E. et al., "Systematic Study of pFET $V_t$ With Hf-Based Gate Stacks With Poly-Si and FUSI Gates." IEEE, p. 44-45, (2004).
Gusev, E. P. et al., "Advanced Gate Stacks With Fully Silicided (FUSI) Gates and High-k Dielectrics: Enhanced Performance at Reduced Gate Leakage." IEEE p. 79-82 (2004).

* cited by examiner

*Primary Examiner*—Laura M Schillinger
(74) *Attorney, Agent, or Firm*—Scully, Scott, Murphy & Presser, P.C.; Robert M. Trepp, Esq.

(57) ABSTRACT

A compound metal comprising $MO_xN_y$, which is a p-type metal having a workfunction of about 4.75 to about 5.3, preferably about 5, eV that is thermally stable on a gate stack comprising a high k dielectric and an interfacial layer is provided as well as a method of fabricating the $MO_xN_y$ compound metal. Furthermore, the $MO_xN_y$ metal compound of the present invention is a very efficient oxygen diffusion barrier at 1000° C. allowing very aggressive equivalent oxide thickness (EOT) and inversion layer thickness scaling below 14 Å in a p-metal oxide semiconductor (PMOS) device. In the above formula, M is a metal selected from Group IVB, VB, VIB or VIIB of the Periodic Table of Elements, x is from about 5 to about 40 atomic % and y is from about 5 to about 40 atomic %.

11 Claims, 4 Drawing Sheets

2

METAL OXYNITRIDE AS A PFET MATERIAL

FIELD OF THE INVENTION

The present invention relates to a semiconductor device and a method of fabricating the same. More particularly, the present invention relates to a complementary metal oxide semiconductor (CMOS) device which includes a thermally stable p-type metal oxynitride (e.g., $MO_xN_y$) compound on a high dielectric constant, k/interfacial layer stack. The present invention also provides a process for forming the thermally stable p-type compound metal which can be integrated within a CMOS processing flow.

BACKGROUND OF THE INVENTION

In standard CMOS devices, polysilicon is typically the standard gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect and relative high electrical sheet resistance, polySi gates commonly used in CMOS devices are becoming a gating factor in chip performance for channel lengths of 0.1 micron and below. Another problem with polySi gates is that the dopant in the polySi gate, such as boron, can easily diffuse through the thin gate dielectric causing further degradation of the device performance.

In order to avoid the problems with polySi gates, it has been suggested to replace the polySi gate with a single metal. Although such technology has been suggested, single metals are not thermally stable on a high k (dielectric constant greater than about 4.0)/interfacial layer gate stack. For example, tungsten, W, and rhenium, Re have stability problems at 1000° C. Tungsten shows interfacial $SiO_2$ regrowth at 4-5 Å after 1000° C., 5 second anneal limiting device scaling and Re is not stable on a high k gate stack, leading to device (mobility) degradation. See, for example, A. Callegari, et al., IEDM 2004, p. 825, S. Francisco Calif., Dec. 13-15, 2004 and Narayanan, et al., VLSI Digest 2004, Hawaii June 2004.

Stability at 1000° C. is required to activate the source/drain implant in self-aligned metal oxide semiconductor field effect transistors (MOSFETs). Also, it has been reported that high electron mobilities are obtained when performing a high temperature anneal. See, for example, A. Callegari, et al., IEDM 2004, p. 825, S. Francisco Calif., Dec. 13-15, 2004. Metal nitrides such as TiN have been extensively used to improve the metal/high k thermal stability. However, most of the work reported on TiN shows that TiN is a mid-gap material which may have limited device performance.

Co-assigned and co-pending U.S. patent application. Ser. No. 11/034,597, filed Jan. 13, 2005 describes TiC as a possible solution for the above-mentioned problem. While metal carbides are electrically stable at 1000° C. and pFET behavior is maintained, carbon diffusion may occur in the interlayers which may, in turn, contribute to carbon contamination.

In view of the above, there is a need for providing a new compound metal which is thermally stable on a gate stack including a high k dielectric which does not cause carbon diffusion as may be the case with metal carbides. In particular, there is a need for providing a new compound metal useful in pFET devices.

SUMMARY OF THE INVENTION

The present invention provides a new compound metal comprising $MO_xN_y$, which is a p-type metal having a workfunction of about 4.75 to about 5.3, preferably about 5, eV which is thermally stable on a gate stack comprising a high k dielectric and an interfacial layer. In the above formula, M is a metal selected from Group IVB, VB, VIB or VIIB of the Periodic Table of Elements (CAS version), x is from 5 to about 40 atomic % and y is from about 5 to about 40 atomic %. Preferably, M is one of Ti, V, Zr, Nb, Mo, Hf, Ta, W or Re, with Ti being most preferred. Preferably, x is from about 5 to about 35 atomic %, with 25 atomic % being most preferred and y is preferably, from about 15 to about 40 atomic %, with 35 atomic weight being most preferred.

Furthermore, the $MO_xN_y$ metal compound of the present invention when very thin (equal to or less than 30 nm) is a very efficient oxygen diffusion barrier at 1000° C. allowing very aggressive equivalent oxide thickness (EOT) and inversion layer thickness scaling below 14 Å in a p-metal oxide semiconductor (pMOS) device. Moreover, the $MO_xN_y$ metal compound does not exhibit any significant carbon diffusion in the interlayers as may be the case with metal carbides.

In broad terms, the present invention provides a semiconductor structure, i.e., film stack, which comprises:
an interfacial layer located on a semiconductor substrate;
a high k dielectric located on said interfacial layer; and
a $MO_xN_y$ gate metal located on said high k dielectric, wherein M is a metal selected from Group IVB, VB, VIB or VIIB of the Periodic Table of Elements, x is from 5 to about 40 atomic % and y is from about 5 to about 40 atomic %.

Additionally, the present invention provides a semiconductor structure that comprises:
a semiconductor substrate, and
a patterned gate region comprising at least an interfacial layer located on a portion of said substrate, a high k dielectric located on said interfacial layer, and a $MO_xN_y$ compound metal located on said high gate dielectric, wherein M is a metal selected from Group IVB, VB, VIB or VIIB of the Periodic Table of Elements, x is from 5 to about 40 atomic % and y is from about 5 to about 40 atomic %.

In addition to the film stack and the semiconductor structure described above, the present invention also provides a method of fabricating a $MO_xN_y$ metal compound that comprises:
providing a metal target and an atmosphere that comprises Ar, nitrogen and oxygen; and
sputtering a $MO_xN_y$ film from said metal target in said atmosphere including oxygen, wherein M is a metal selected from Group IVB, VB, VIB or VIIB of the Periodic Table of Elements and x and y are as defined above.

The present invention also provides a method of fabricating the semiconductor structure described above in which the inventive process for forming a $MO_xN_y$ film is employed. In general terms, the semiconductor structure is formed by first providing a stack comprising a high k dielectric and an interfacial layer on a surface of a substrate; and thereafter forming a $MO_xN_y$ film on said stack utilizing the processing steps mentioned above.

The $MO_xN_y$ metal gate can be used alone as the gate electrode and during fabrication of the FET a non-hydrogen containing cap is formed on the upper surface thereof. The term "non-hydrogen containing" is used throughout the present application to denote that no hydrogen is used in forming the cap.

It is noted that the term high k dielectric is used throughout the present application to denote an insulator material whose dielectric constant k, is greater than $SiO_2$, e.g., greater than 4.0. Preferably, the high k dielectric has a k that is about 7.0 or greater.

The term "interfacial layer" is used throughout the present application to denote an insulator material that comprises atoms of at least a semiconductor, such as Si, and O. $SiO_2$, and SiON are examples of different types of interfacial layers that can be employed in the present invention.

DETAILED DISCUSSION OF THE INVENTION

Figure 1A:
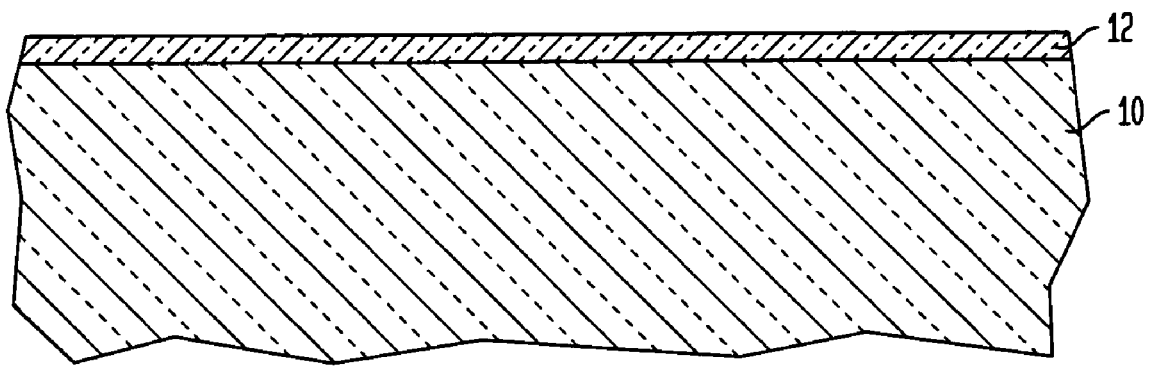
FIGS. 1A-1C are pictorial representations (through cross sectional views) illustrating the various processing steps used in forming a film stack structure which includes the $MO_xN_y$ metal compound as a p-type metal gate on a stack comprising a high k dielectric and an interfacial layer.

The present invention, which provides a $MO_xN_y$ compound metal that can be used as a thermally stable p-metal gate on a stack comprising a high k dielectric and an interfacial layer as well as a method of fabricating the same, will now be described in greater detail by referring to the drawings that accompany the present application. It is noted that the drawings of the present invention are provided for illustrative purposes and thus they are not drawn to scale.

Figure 1B:
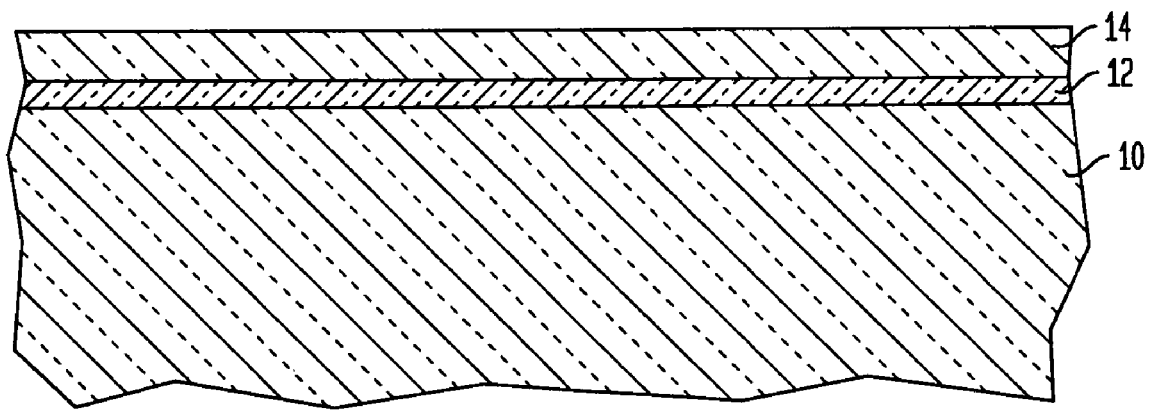
Figure 1C:
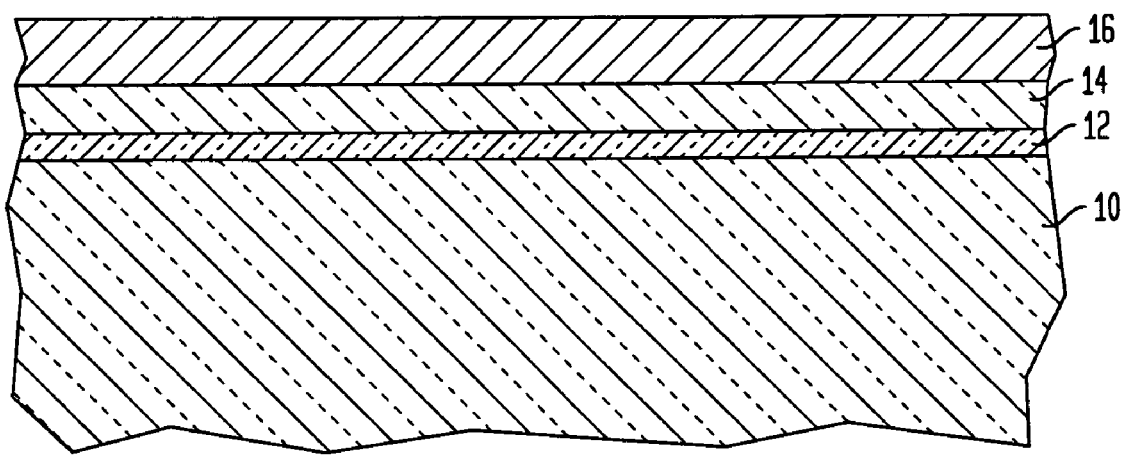

Reference is first made to FIGS. 1A-1C which illustrate basic processing steps that are used in forming a film stack structure that includes the inventive $MO_xN_y$ compound metal on a stack containing a high k dielectric and an interfacial layer. FIG. 1A shows an initial film stack structure that includes an interfacial layer 12 on a surface of a semiconductor substrate 10.

The semiconductor substrate 10 employed in the present invention comprises any semiconducting material including, but not limited to: Si, Ge, SiGe, SiC, SiGeC, Ga, GaAs, InAs, InP and all other IV/IV, III/V, or II/VI compound semiconductors. Semiconductor substrate 10 may also comprise an organic semiconductor or a layered semiconductor such as Si/SiGe or a semiconductor-on-insulator such as, for example, a silicon-on-insulator (SOI) or a SiGe-on-insulator (SGOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein.

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells". The semiconductor substrate 10 may be strained, unstrained or a combination thereof. Moreover, the semiconductor substrate 10 may have any crystallographic orientation including, for example, 100, 110, 111 or a combination thereof. Alternatively, the semiconductor substrate 10 may be a hybrid substrate that includes at least two planar surfaces of different crystallographic orientation. The hybrid substrate can be formed by techniques such as described, for example, in U.S. Ser. No. 10/250,241, filed Jun. 17, 2003, now U.S. Publication No. 20040256700A1, U.S. Ser. No. 10/725,850, filed Dec. 2, 2003, and U.S. Ser. No. 10/696,634, filed Oct. 29, 2003, the entire contents of each are incorporated herein by reference.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

Interfacial layer 12 is then formed atop the surface of the semiconductor substrate 10 utilizing a thermal process such as oxidation or oxynitridation, a deposition process such as chemical vapor deposition (CVD), plasma-assisted CVD, atomic layer deposition (ALD), evaporation, sputtering, and chemical solution deposition, or a combination thereof. Alternatively, a deposition process and nitridation can be used to form the interfacial layer 12. The interfacial layer 12 comprising atoms of at least a semiconductor such as, for example, Si, and O, with N being optional. The interfacial layer 12 thus may comprise $SiO_2$, SiON, silicates thereof, or multilayers thereof. In some embodiments, the interfacial layer 12 comprises $SiO_2$, while in other embodiments the interfacial layer 12 comprises SiON. The interfacial layer 12 comprises from about 1 to about 80, typically from about 1 to about 20, atomic percent Si. The remaining is O and/or N. A chemical oxide is typically used with no N present. The Si can be continuously present throughout the interfacial layer 12 or it can be graded.

The interfacial layer 12 typically has a dielectric constant from about 4.0 to about 20, with a dielectric constant from about 4.5 to about 18 being even more typical. The interfacial layer 12 typically has a thickness from about 0.1 to about 5 nm, with a thickness from about 0.2 to about 2.5 nm being more typical.

In accordance with an embodiment of the present invention, the interfacial layer 12 is a silicon oxide layer having a thickness from about 0.6 to about 0.8 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the interfacial layer 12 can also be formed by treating the HF-last semiconductor surface in ozonated aqueous solutions, with the ozone concentration usually varying from, but not limited to: 2 parts per million (ppm) to 40 ppm.

Next, and as shown in FIG. 1B, a high k dielectric 14 is formed on a surface of the interfacial layer 12. The term "high k" denotes an insulator whose dielectric constant is greater than 4.0, typically from about 7.0 or greater. Throughout this application, the dielectric constants are measured in a vacuum. The high k dielectric 14 can be formed by a thermal growth process such as, for example, oxidation, nitridation or oxynitridation. Alternatively, the high k dielectric 14 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The high k dielectric 14 may also be formed utilizing any combination of the above processes.

Illustratively, the high k dielectric 14 employed in the present invention includes, but is not limited to: an oxide, nitride, oxynitride, and/or silicate (including metal silicates and nitrided metal silicates). In one embodiment, it is preferred that the high k dielectric 14 is comprised of an oxide such as, for example, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of the high k dielectric 14 include $HfO_2$, hafnium silicate or hafnium silicon oxynitride.

The physical thickness of the high k dielectric 14 may vary, but typically, the high k dielectric 14 has a thickness from about 0.5 to about 10 nm, with a thickness from about 0.5 to about 3 nm being more typical.

After providing the stacked structure shown in FIG. 1B, a $MO_xN_y$ compound metal layer 16 is then formed atop the high k dielectric 14 providing the structure shown, for example, in FIG. 1C. In accordance with the present invention, M includes at least one metal selected from Group IVB, VB, VIB or VIIB of the Periodic Table of Elements (CAS version). Typically, M is one of Ti, V, Zr, Nb, Mo, Hf, Ta, W or Re, with Ti being most typical. In the above formula, x is from about 5 to about 40 atomic %, preferably from about 5 to about 35 atomic %, with 25 atomic % being most preferred. The variable y is from about 5 to about 40 atomic %, preferably from about 15 to about 40 atomic %, with 35 atomic % being most preferred. The most preferred compound metal thus is $Ti_{0.4}O_{0.25}N_{0.35}$.

The $MO_xN_y$ compound metal layer 16 is formed by first providing a metal (M) target and an atmosphere that comprises Ar, $N_2$ and oxygen—the oxygen is present within the atmosphere in a concentration that can introduce from about 5 to about 40 atomic % oxygen into the resultant film. Next, a $MO_xN_y$ film is sputtered from said metal target in said atmosphere. The sputtering process occurs in a reactor chamber of any conventional sputtering apparatus. The metal target used in the present invention includes any solid source of one of the above-mentioned metals.

The oxygen can be introduced into the sputtering atmosphere utilizing one of the following two methods: (I) If the substrate and the target are positioned close to each in the reactor chamber, an oxygen leak valve can be used to introduce oxygen into the atmosphere. (II) If the substrate and the target are separated by some distance (greater than 3"), the oxygen can be introduced from the pre-sputtering background pressure, which can be from about $1\times10^{-4}$ Torr or below. In this case, the metal grabs the oxygen during the sputtering process.

The flow of Ar and $N_2$ employed in the present invention is from about 1 to about 100 sccm for Ar and from about 1 to about 100 sccm for $N_2$ source. More typically, the flow of Ar is about 20 sccm and the flow of $N_2$ is about 1.4 sccm. The other sputtering conditions such as temperature, gas pressure and time are conventional and are well known to those skilled in the art.

The thickness of the $MO_xN_y$ film 16 formed may vary depending on the sputtering conditions used and the type of device to be fabricated. Typically, the $MO_xN_y$ film 16 has a thickness, after sputtering, from about 1 to about 200 nm, with a thickness of about 30 nm or less being even more typical.

The structure shown in FIG. 1C can then be formed into a CMOS device, e.g., FET, utilizing any conventional CMOS processing flow, including a replacement gate process. In some embodiments, the stacked structure shown in FIG. 1C can be processed by forming a non-hydrogen containing cap 18 on top of the $MO_xN_y$ layer 16. This particular embodiment is shown in FIG. 2A-2D.

Figure 2A:
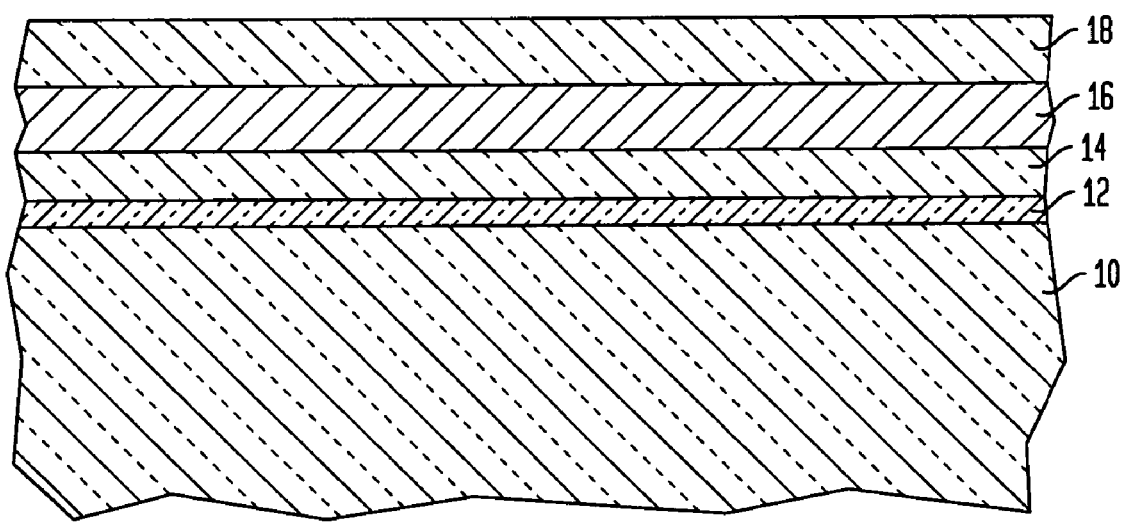
FIGS. 2A-2D are pictorial representations (through cross sectional views) illustrating the basic processing steps of the present invention for forming a non-hydrogen-containing cap/gate metal self-aligned FET structure.

In the embodiment illustrated in FIG. 2A, a non-hydrogen containing cap 18 such as amorphous silicon or doped amorphous silicon is formed atop the $MO_xN_y$ layer 16. By "non-hydrogen" it is meant that the cap material does not include hydrogen. It is noted that the presence of the cap 18 prevents the metal oxynitride layer 16 from undergoing a workfunction change during further processing. The workfunction change tends to go to mid-gap when cap 18 is not present. The cap 18 is formed utilizing conventional non-hydrogen containing deposition processes well known in the art. The cap 18 is typically doped utilizing an in-situ deposition process or by deposition, ion implantation and annealing. The dopant is a p-type dopant since $MO_xN_y$ is a p-type metal. The thickness, i.e., height, of the cap 18 formed at this point of the present invention may vary depending on the process employed. Typically, the cap 18 has a vertical thickness from about 20 to about 180 nm, with a thickness from about 40 to about 150 nm being more typical.

Figure 2B:
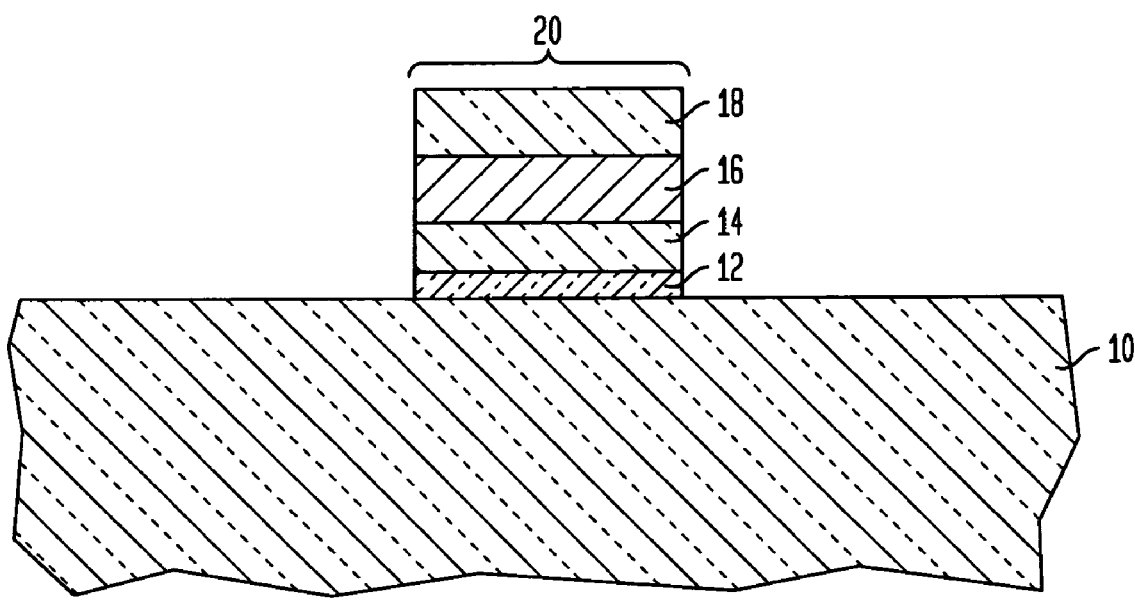

In the processing embodiment illustrated, the cap 18, the $MiO_xN_y$ layer 16, and optionally the high k dielectric 14 and the interfacial layer 12 are then patterned by lithography and etching so as to provide a patterned gate region or stack 20. Although a single patterned gate region (or stack) 20 is shown, the present invention contemplates forming a plurality of patterned gate regions (or stacks) 20. When a plurality of patterned gate regions (or stacks) are formed, the gate regions (or stacks) may have the same dimension, i.e., length, or they can have variable dimensions to improve device performance. Each patterned gate stack (or region) 20 at this point of the present invention includes at least a patterned $MO_xN_y$ layer 16. FIG. 2B shows the structure after pattern gate region (or stack) 20 formation. In the illustrated embodiment, the cap 18, the $MO_xN_y$ layer 16, the high k dielectric 14 and the interfacial layer 12 are etched, i.e., patterned, during this step of the present invention.

The lithographic step includes applying a photoresist to the upper surface of the blanket layered structure shown in FIG. 2A, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned gate region (or stack) 20 include, but are not limited to: reactive ion etching, ion beam etching, plasma etching or laser ablation. The dry etching process employed is typically, but not always, selective to the underlying high k dielectric 14 therefore this etching step does not typically remove the stack containing the high k dielectric 14 and the interfacial layer 12. In some embodiments and as shown in FIG. 2B, this etching step may, however, be used to remove portions of the high k dielectric 14 and the interfacial layer 12 that are not protected by the material layers of the gate region (or stack) that were previously etched.

Figure 2C:
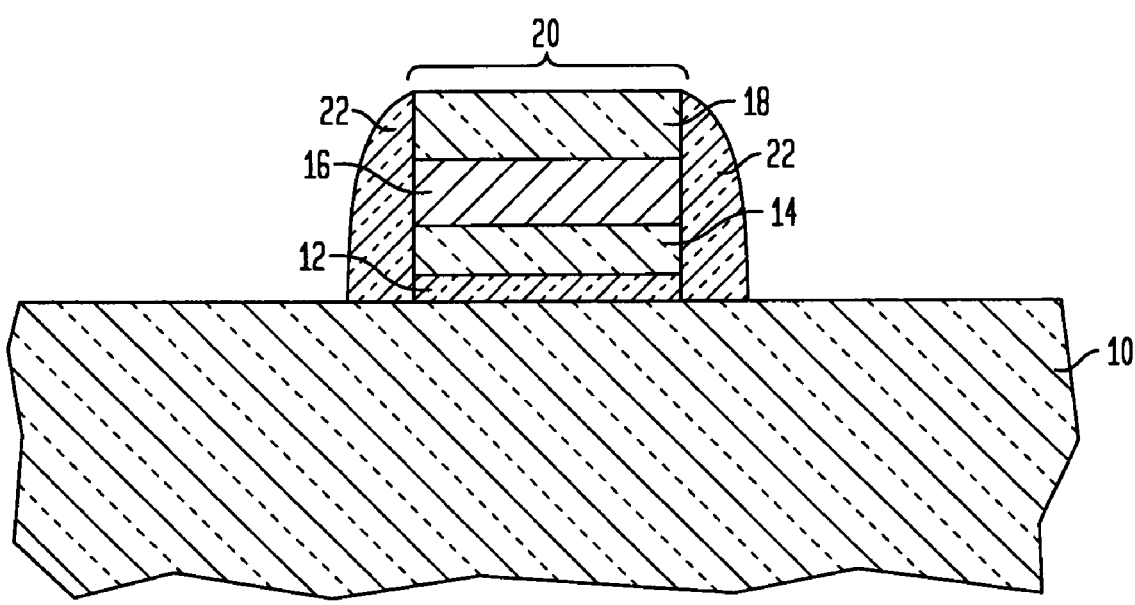

Next, at least one spacer 22 is typically, but not always, formed on exposed sidewalls of each patterned gate region (or stack) 20, see, for example, FIG. 2C. The at least one spacer 22 is comprised of an insulator such as an oxide, nitride, oxynitride and/or any combination thereof. The at least one spacer 22 is formed by deposition and etching. Non-hydrogen containing process should be used in forming the at least one spacer 22.

The width of the at least one spacer 22 must be sufficiently wide such that the source and drain silicide contacts (to be subsequently formed) do not encroach underneath the edges of the gate region (or stack) 20. Typically, the source/drain silicide does not encroach underneath the edges of the gate region (or stack) 20 when the at least one spacer 22 has a width, as measured at the bottom, from about 20 to about 80 nm.

The gate region (or stack) 20 can be optionally passivated prior to spacer formation by subjecting the same to a thermal oxidation, nitridation or oxynitridation process. Passivation should preferably be performed utilizing a non-hydrogen containing process. The passivation step forms a thin layer of passivating material (not shown) about the gate region (or stack) 20. This step may be used instead or in conjunction with the previous step of spacer formation. When used with the spacer formation step, spacer formation occurs after the gate region (or stack) 20 passivation process.

Source/drain diffusion regions 24 (with or without the spacers present) are then formed into the substrate. The source/drain diffusion regions 24 are formed utilizing ion implantation and an annealing step. The annealing step serves to activate the dopants that were implanted by the previous implant step. The conditions for the ion implantation and annealing are well known to those skilled in the art. The structure formed after ion implantation and annealing is shown in FIG. 2D.

The source/drain diffusion regions 24 may also include extension implant regions (not separately labeled) which are formed prior to source/drain implantation using a conventional extension implant. The extension implant may be followed by an activation anneal, or alternatively the dopants implanted during the extension implant and the source/drain implant can be activated using the same activation anneal cycle. Halo implants (not shown) are also contemplated herein. The source/drain extensions are typically shallower than the deep source/drain regions and they include an edge that is aligned with an edge of the patterned gate region (or stack) 20.

Next, and if not previously removed, the exposed portion of the high k dielectric 14 and the underlying interfacial layer 12 are removed utilizing a chemical etching process that selectively removes these insulating materials. This etching step stops on an upper surface of the semiconductor substrate 10. Although any chemical etchant may be used in removing the exposed portions of the high k dielectric 14 and the underlying interfacial layer 12, in one embodiment dilute hydrofluoric acid (DHF) is used.

Figure 2D:
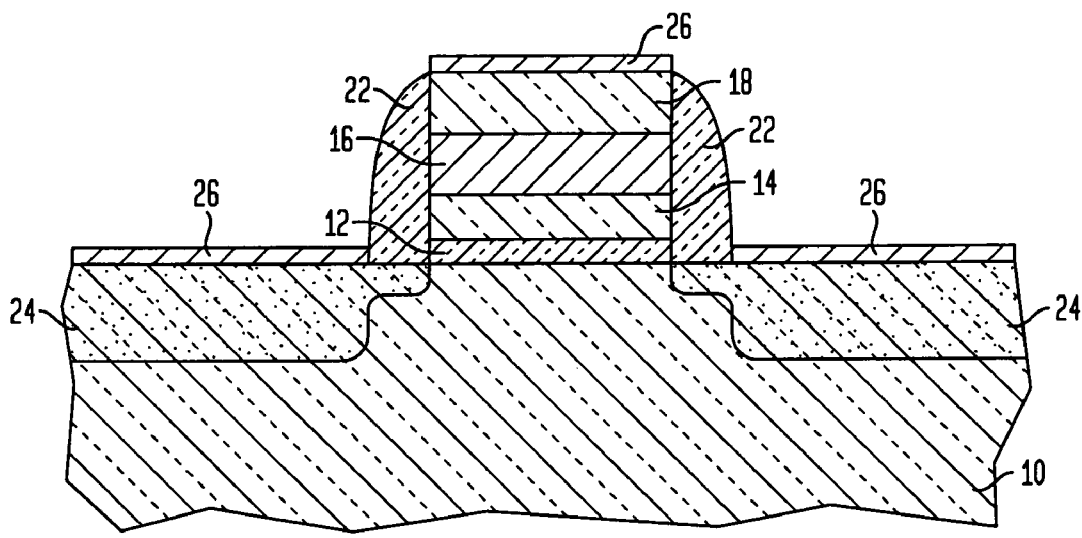

FIG. 2D also shows the presence of silicide regions 26 atop the source/drain diffusion regions 24 and the cap 18. The silicide regions 26 are formed utilizing any conventional silicidation process. Typically, a Si-containing material, such as epitaxial Si, is formed prior to silicidation on both the source/drain regions 24 and the non-hydrogen cap 18. In embodiments in which the substrate is a Si-containing substrate, the Si-containing material can be formed only atop the cap 18.

The silicidation process comprises forming a conductive and refractory metal such as Co, Ti, W, Ni, Pt or alloys thereof with other alloying additives, such as C, Ge, Si, and etc., on top of the area to be silicided. A conventional deposition process, such as CVD, PECVD, sputtering, evaporation or plating, can be used. Optionally, a barrier layer may be formed over the metal layer that protects the metal from oxidation. Examples of optional barrier layers include, for example, SiN, TiN, TaN, TiON and combinations thereof. Following metal deposition the structure is subjected to at least a first anneal that causes reaction between the deposited metal and Si and subsequent formation of a metal silicide. The annealing is typically performed at a temperature from about 250° to about 800° C., with a first annealing temperature from about 400° to about 550° C. being more typical.

In some embodiments, the first anneal forms a metal rich silicide phase, which is highly resistant to a selective etch process. When a metal rich phase is produced, a second higher temperature anneal is required to form a low resistivity silicide. In other embodiments, the first anneal is sufficient in forming the low resistivity silicide.

Following the first anneal, the unreacted and remaining portions of the deposited metal are removed using a conventional etch process, such as wet etching, reactive-ion etching (RIE), ion beam etching, or plasma etching.

If needed, a second anneal is performed after the etching process. The second annealing is typically performed at higher temperatures than the first annealing. A typical temperature range for the second, optional, anneal is from about 550° to about 900° C.

Further CMOS processing such as the formation of BEOL (back-end-of-the-line) interconnect levels with metal interconnects can be formed utilizing processing steps that are well known to those skilled in the art.

The following example provides an illustration of the inventive process as well as some advantages that can be obtained from using the same in forming a $TiO_xN_y$-containing gate stack.

EXAMPLE

In this example, a $TiO_xN_y/HfO_2/SiO_2$ stack was formed on a surface of a p-type Si wafer and an n-type Si wafer. The $SiO_2$ interfacial layer was formed by oxidation of the Si wafer. The thickness of the $SiO_2$ interfacial layer was about 1 nm. A $HfO_2$ dielectric having a thickness of about 3 nm was then formed on the $SiO_2$ interfacial layer by MOCVD. The $TiO_xN_y$ layer was then formed by sputtering in an $Ar/N_2$ atmosphere from a Ti target. The sputtering was performed in a long throw system (6" separation between the substrate and target) and, as such, 25 atomic percent oxygen was incorporated into the Ti metal from a pre-sputter background pressure of about $1\times10^{-7}$ Torr. The $TiO_xN_y$ layer had a thickness of about 30 nm.

Figure 3:
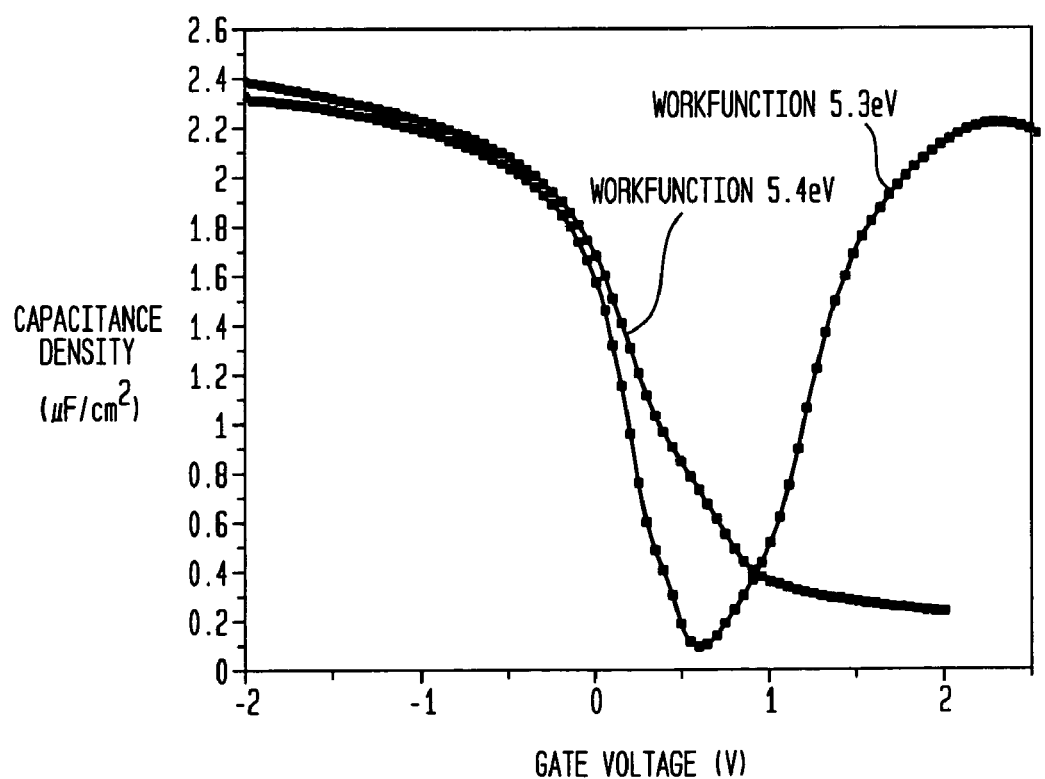
FIG. 3 is a graph showing the capacitance vs. voltage (CV) characteristics of a $TiO_xN_y/HfO_2/SiO_2$ gate stack after annealing at 1000° C. in $N_2$ and then annealing in a forming gas ambient.

After providing the stack, the stack was subjected to a rapid thermal anneal at 1000° C. in $N_2$ and a forming gas at 450° C. anneal was separately performed. FIG. 3 shows the CV characteristics of this stack on both the n-type substrate and the p-type substrate. The CV was taken at 10 kHz and traced back and forth. The traces show no hysterisis indicating low charge trapping. The CV characteristic looks ideal indicating low interface states of below $1\times10^{11}$ charges/cm$^2$. Note that the workfunction for these devices (on both substrates) was about 5 eV or greater which is typical for a pMOS device. Also notice that the EOT (classical) was only about 14 Å. Thus, the pFET fabricated using this stack should operate at an inversion layer thickness of about 14 Å with substantial gate leakage reduction (~4-5 orders of magnitude) because of the high k dielectric implemented in the gate stack. Current $SiO_2$ technology has an inversion layer thickness of about 19 Å with a much higher gate leakage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   an interfacial layer located on a semiconductor substrate;
   a high k dielectric having a dielectric constant of greater than silicon dioxide located on said interfacial layer; and
   a gate conductor composed of a $MO_xN_y$ gate metal located on an upper surface of said high k dielectric, wherein M is a metal selected from Group IVB, VB, VIB or VIIB of the Periodic Table of Elements, x is from 5 to about 40 atomic % and y is from about 5 to about 40 atomic %.

2. The semiconductor structure of claim 1 wherein said interfacial layer comprises atoms of Si and O, and optionally N.

3. The semiconductor structure of claim 2 wherein said interfacial layer comprises $SiO_2$, SiON or silicates thereof.

4. The semiconductor structure of claim 1 wherein said high k dielectric is a Hf based material.

5. The semiconductor structure of claim 1 wherein said interfacial layer comprises $SiO_2$ or SiON and said high k dielectric comprises $HfO_2$, Hf silicate or Hf oxynitride.

6. The semiconductor structure of claim 1 wherein said $MO_xN_y$ gate metal has a workfunction between 4.75 and 5.3 eV.

7. The semiconductor structure of claim 1 wherein M is one of Ti, V, Zr, Nb, Mo, W, Ta, Hf or Re.

8. The semiconductor structure of claim 7 wherein M is Ti.

9. The semiconductor structure of claim 8 wherein x is 25 atomic % and y is 35 atomic %.

10. The semiconductor structure of claim 1 further comprising a non-hydrogen containing cap atop said $MO_xN_y$ gate layer.

11. The semiconductor structure of claim 1 wherein said interfacial layer, said high k dielectric and said $MO_xN_y$ gate metal are patterned into a gate region.

* * * * *